US009653454B1

United States Patent
Lee et al.

(10) Patent No.: US 9,653,454 B1
(45) Date of Patent: May 16, 2017

(54) METHODS FOR AN ESD PROTECTION CIRCUIT INCLUDING TRIGGER-VOLTAGE TUNABLE CASCODE TRANSISTORS

(71) Applicant: GLOBALFOUNDRIES Inc., Grand Cayman (KY)

(72) Inventors: Chien-hsin Lee, Malta, NY (US); Mahadeva Iyer Natarajan, Clifton Park, NY (US); Manjunatha Prabhu, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/215,043

(22) Filed: Jul. 20, 2016

(51) Int. Cl.
*H01L 21/336* (2006.01)
*H01L 27/02* (2006.01)
*H01L 29/74* (2006.01)
*H01L 29/66* (2006.01)

(52) U.S. Cl.
CPC .... *H01L 27/0262* (2013.01); *H01L 29/66371* (2013.01); *H01L 29/7408* (2013.01)

(58) Field of Classification Search
CPC ............ H01L 29/66371; H01L 29/7408
USPC ........................................ 257/154; 438/234
See application file for complete search history.

(56) References Cited

U.S. PATENT DOCUMENTS

| 8,508,893 | B2 * | 8/2013 | Thijs .................. H03F 1/523 361/111 |
| 9,082,623 | B2 * | 7/2015 | Yang ................. H01L 27/0288 |
| 2012/0319164 | A1 | 12/2012 | Inaba |
| 2013/0258532 | A1 | 10/2013 | Clark, Jr. et al. |

* cited by examiner

*Primary Examiner* — Chandra Chaudhari
(74) *Attorney, Agent, or Firm* — Ditthavong & Steiner, P.C.

(57) ABSTRACT

Methods to forming trigger-voltage tunable cascode transistors for an ESD protection circuit in FinFET IC devices and resulting devices. Embodiments include providing a substrate including adjacent first-type well areas, over the substrate, each pair of first-type well areas separated by a second-type well area; providing one or more junction areas in each first and second type well area, each junction area being a first type or a second type; forming fins, spaced from each other, perpendicular to and over the first and second type junction areas; and forming junction-type devices by forming electrical connections between the first and second type junction areas in the first-type well areas and the substrate, wherein a first-stage junction-type device in a first-type well area includes stacked first and second type junction areas, and wherein the first-stage junction-type device is adjacent a second-type well area including first and second type junction areas.

17 Claims, 4 Drawing Sheets

METHODS FOR AN ESD PROTECTION CIRCUIT INCLUDING TRIGGER-VOLTAGE TUNABLE CASCODE TRANSISTORS

TECHNICAL FIELD

The present disclosure relates generally to designing and fabricating integrated circuit (IC) devices. The present disclosure is particularly applicable to forming an electrostatic discharge (ESD) protection circuit for use in fin-type field-effect transistor (FinFET) IC devices in the 7 nanometer (nm) technology node and beyond.

BACKGROUND

Generally, IC devices include ESD protection circuits to divert and discharge high electrical currents caused by ESD events that may occur during fabrication, handling, or normal use of the devices. Without ESD protection circuits, the high electrical currents may damage the circuits in an IC device. Advanced IC devices may utilize FinFET technology for increased component density where elements (e.g. silicon fins) of the components may be smaller and more sensitive to variations in operating conditions such as an operating voltage, input current, ESD stress, fabrication processes, etc. Without an effective ESD protection circuit, a FinFET device may be easily damaged and unable to meet required ESD specifications. Traditional ESD circuits may be inefficient (e.g. require larger silicon area), limited to a fixed operating voltage, or may be ineffective in providing sufficient protection (e.g. failing 2 kV human-body-model ESD specification test).

A diode triggered silicon controlled rectifier (SCR) is a good candidate for FinFET ESD protection, since it turns on as the applied voltage is greater than n×0.7V, where n is a coefficient for a multiple of 0.7V (e.g. 3×0.7V), and can clamp the voltage as the applied voltage is greater than a trigger-voltage (Vt1). However, different applications often need different Vt1's, and changing the device Vt1 sacrifices the device area.

Therefore, a need exists for methodology enabling formation of an efficient and effective ESD protection circuit for FinFET devices and the resulting devices.

SUMMARY

An aspect of the present disclosure is a method for forming trigger-voltage tunable cascode transistors for an ESD protection circuit in FinFET IC devices.

Another aspect of the present disclosure is an ESD protection circuit having trigger-voltage tunable cascode transistors for FinFET IC devices.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing a substrate including adjacent first-type well areas, over the substrate, each pair of first-type well areas separated by a second-type well area; providing one or more junction areas in each first and second type well area, each junction area being a first type or a second type; forming fins, spaced from each other, perpendicular to and over the first and second type junction areas; and forming junction-type devices by forming electrical connections between the first and second type junction areas in the first-type well areas and the substrate, wherein a first-stage junction-type device in a first-type well area includes stacked first and second type junction areas, and wherein the first-stage junction-type device is adjacent a second-type well area including first and second type junction areas.

In one aspect, the first-type well areas are n-type and include p-type and n-type junction areas.

In another aspect, the second-type well areas are p-type and include p-type or p-type and n-type junction areas.

In a further aspect, the substrate is p-type and the junction-type devices include pnp or npn type bipolar transistors.

In an additional aspect, the junction-type devices include a pn-type diode.

One aspect includes connecting the junction areas in the second-type well areas to an electrical ground.

Another aspect includes forming isolation trench regions separating the first and second type well areas.

In one aspect, the second-type well area adjacent the first-stage junction-type device includes multi second-type junction areas.

A further aspect includes setting a spacing between the first and second type junction areas and between adjacent second type junction areas based on a target trigger-voltage.

Another aspect of the present disclosure includes a device including: a substrate including adjacent first-type well areas, over the substrate, each pair of first-type well areas separated by a second-type well area; one or more junction areas in each first and second type well area, each junction area being a first type or a second type; fins, spaced from each other, perpendicular to and over the first and second type junction areas; and junction-type devices formed by electrical connections between the first and second type junction areas in the first-type well areas and the substrate, wherein a first-stage junction-type device in a first-type well area includes stacked first and second type junction areas, and wherein the first-stage junction-type device is adjacent a second-type well area including first and second type junction areas.

In one aspect, the first-type well areas are n-type and include p-type and n-type junction areas.

In another aspect, the second-type well areas are p-type and include p-type or p-type and n-type junction areas.

In a further aspect, the substrate is p-type and the junction-type devices include pnp or npn type bipolar transistors.

In an additional aspect, the junction-type devices include a pn-type diode.

Another aspect includes connections between junction areas in the second-type well areas to an electrical ground.

In one aspect, the second-type well area adjacent the first-stage junction-type device includes multi second-type junction areas.

A further aspect includes a spacing between the first and second type junction areas and between adjacent second type junction areas is based on a target trigger-voltage.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problems of inefficient ESD protection circuits for FinFET based IC devices. The present disclosure addresses and solves such problems, for instance, by, inter alia, adding grounded N+ diffusions to the first stage transistors, using smaller multi-pn diodes instead of long diodes in the first stage, changing resistance of N-well and P-well areas by changing spacing between P-type and/or N-type junction areas in the N or P wells, and using smaller multi P-type junction areas instead of a long P-type junction area in the first stage transistor to provide an ESD circuit with a tunable ESD trigger-voltage without increasing the IC device dimension.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
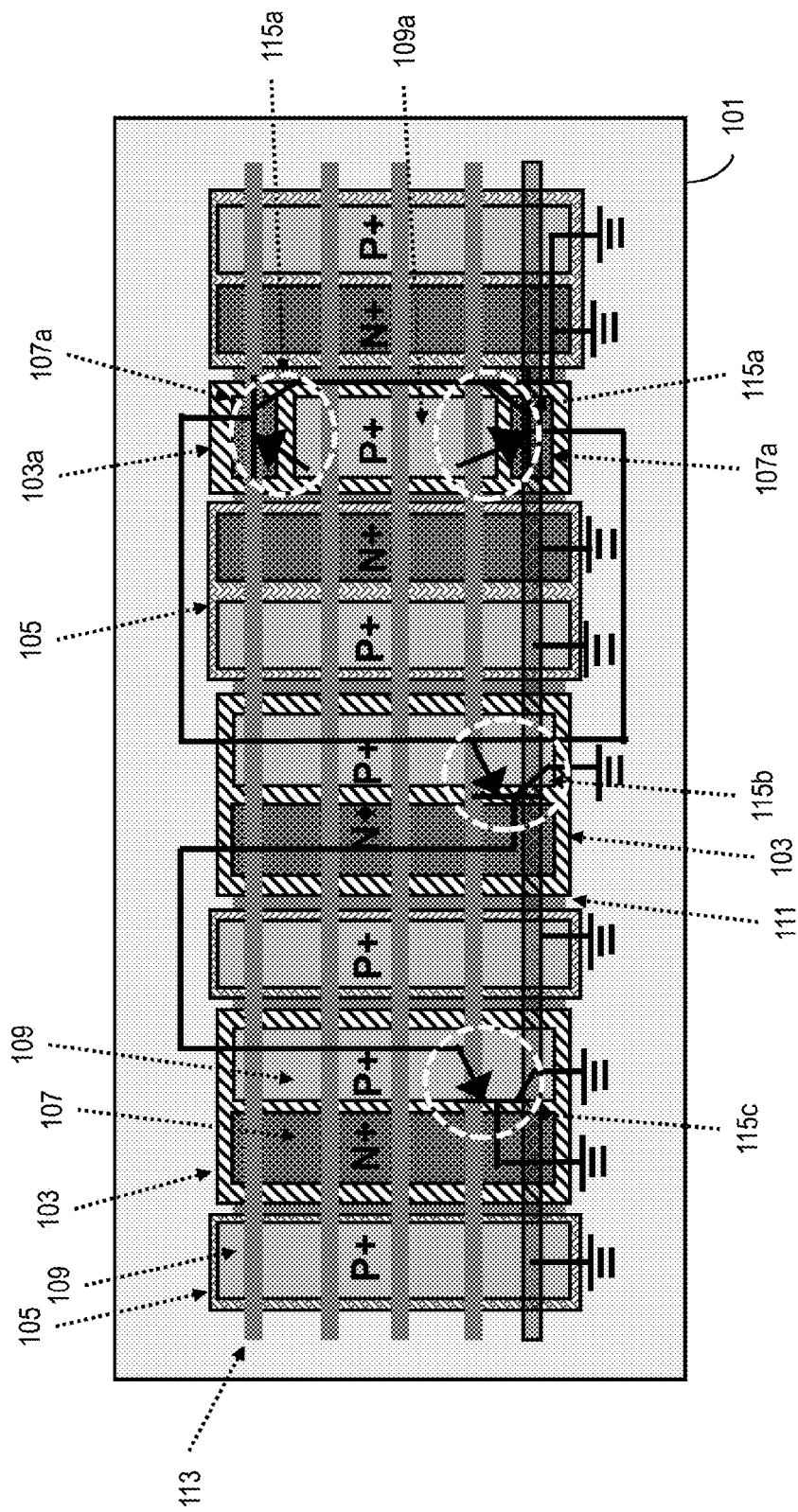
FIGS. 1A and 1C illustrate top views of layouts of ESD protection circuits including trigger-voltage tunable cascode transistors, in accordance with an exemplary embodiment.

FIG. 1A illustrates a substrate 101 (e.g. p-type) including adjacent first-type well areas 103 (e.g. n-well), over the substrate, where each pair of the first-type well area 103 is separated by a second-type well area 105 (e.g. p-well). Each first or second type well area 103/105 may include one or more first-type junction areas 107 and/or second-type junction areas 109. The first-type well areas 103 may be n-type and include p-type and n-type, 107/109, junction areas. The second-type well areas 105 may be p-type and include p-type junction areas 107, or p-type and n-type junction areas 107/109. As illustrated, a first-type well area 103a may include one or more of each first and second type junction areas 107a and 109a, which may be configured differently (e.g. stacked) from the junction areas 107/109 (e.g. adjacent each other) in other first-type well areas 103. Adjacent first and second type well areas 103/105 are separated by isolation trench regions 111 filled with dielectric material (e.g. silicon dioxide).

Fins 113 may be formed spaced from each other, and perpendicular to and over the first and second type junction areas 107/109. Junction-type devices 115a, 115b, and 115c may be formed by forming electrical connections between the first and second type junction areas 107/109 in the first-type well areas 103 and the substrate 101. The junction-type devices include PNP and/or NPN type bipolar transistors. The junction areas 107 and/or 109 in the second-type well areas 105 may be connected to an electrical ground.

Figure 1B:
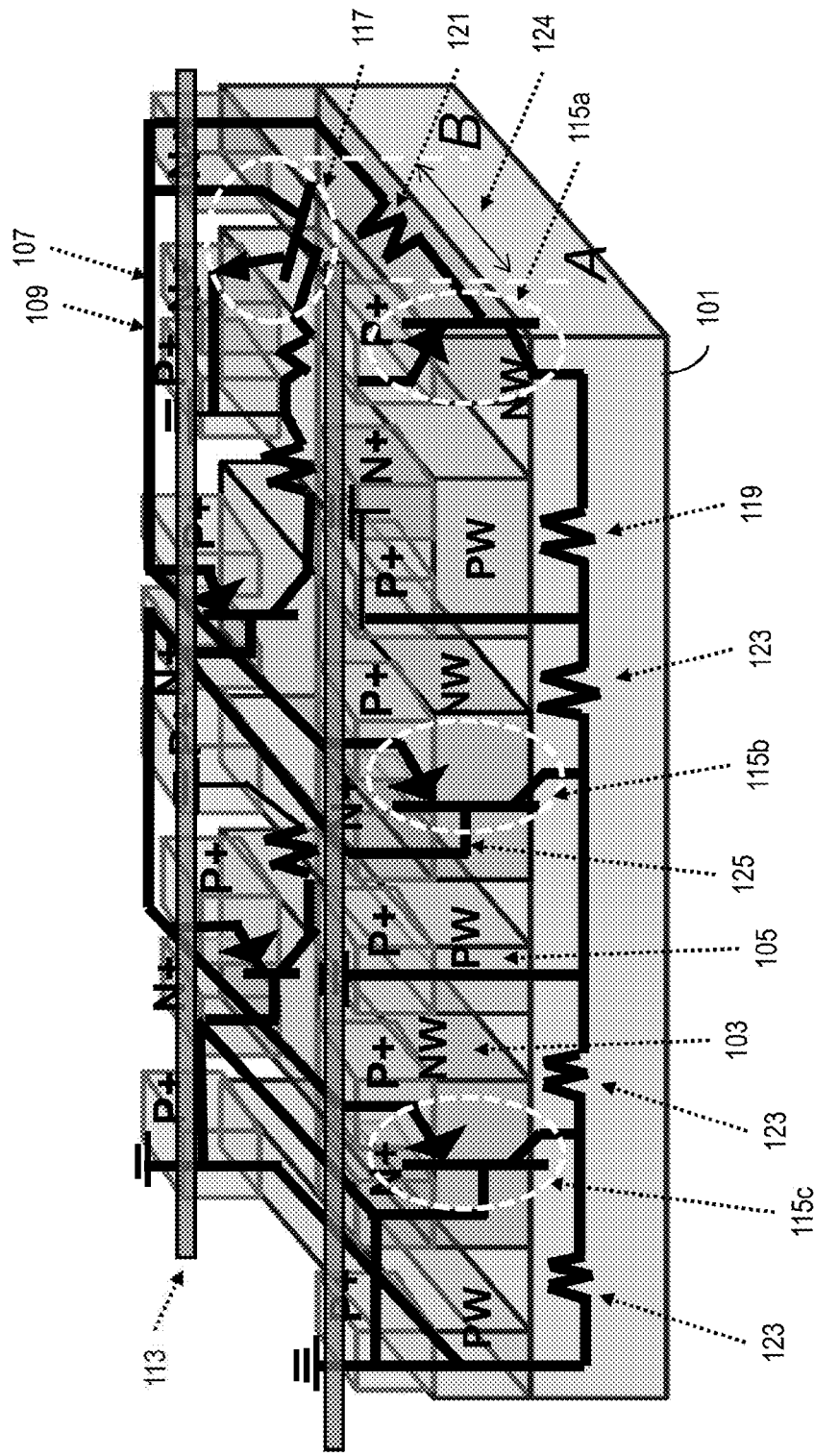
FIG. 1B illustrates a three dimensional view of the layouts of FIGS. 1A and 1C, in accordance with an exemplary embodiment.

FIG. 1B illustrates a three dimensional view of the layout of FIG. 1A including PNP devices 115a, 115b, and 115c and NPN device 117. Also illustrated are p-well resistance equivalence ($R_{pw}$) 119, n-well resistance equivalence ($R_{nw}$) 121, and the substrate resistance equivalence 123 associated with the devices 115. $R_{nw}$ 121 is proportional to $W_{pn}$ 124, between points A and B. A base 125 of one of the PNP devices 115a through 115c is near/on an edge of junction areas 107/109, and the n-type junction areas 103 are within the PNP devices. By changing the spacing between the first and second type junction areas 107/109, the value of the $R_{NW}$ may be changed. By changing the spacing between adjacent second type junction areas 109, the value of the $R_{PW}$ may be changed. Increasing the spacing between the junction areas 107/109 or 109/109 (e.g., between adjacent first and second types, or second and second types) will increase the $R_{NW}$ or $R_{PW}$, respectively. An ESD trigger-voltage (Vt1) may be tuned/changed by effectuating changes in the $R_{NW}$ and $R_{PW}$, as explained with respect to FIG. 1D.

Figure 1C:
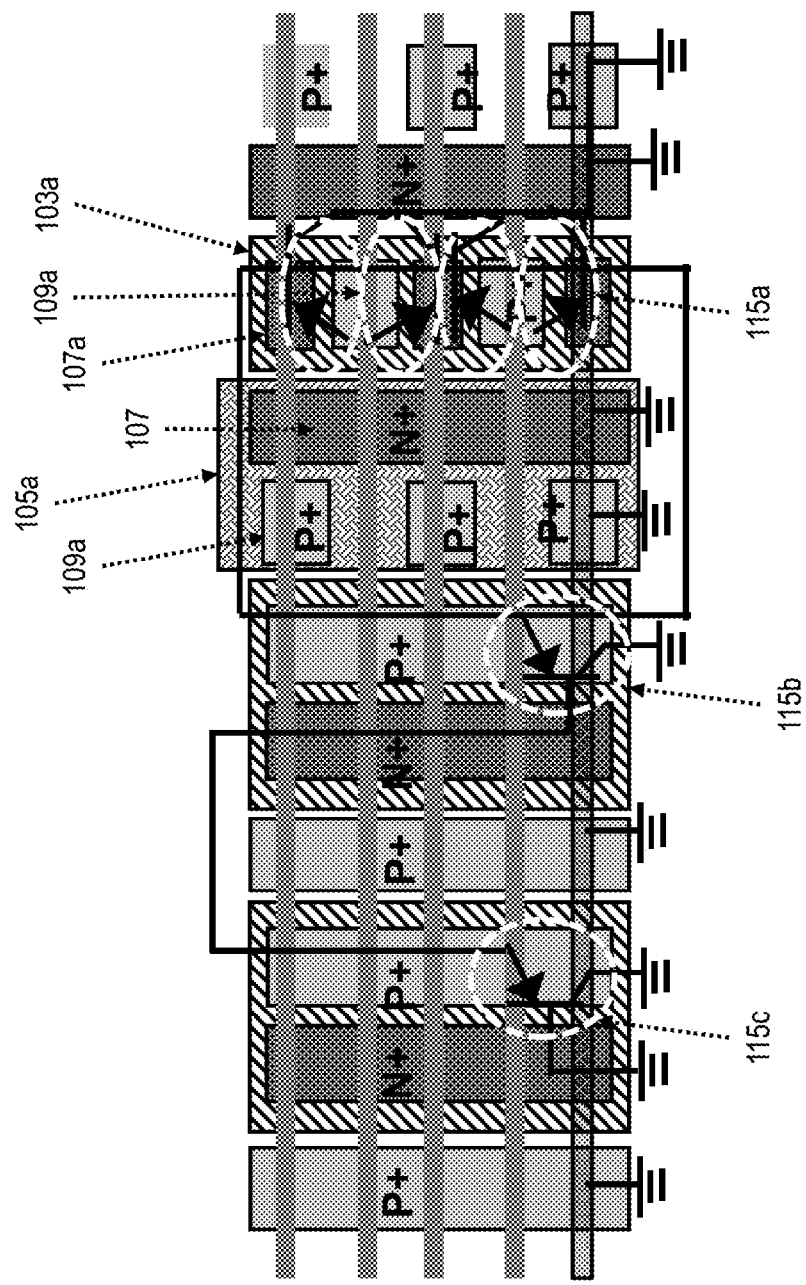

As illustrated in FIG. 1C, the first-type well area 103a includes multiple smaller first and second type junction areas 107a and 109a that are stacked in alternating positions to form a first stage junction-type devices 115a. A second-type well area 105a, in the first stage, includes multiple smaller second type junction areas 109a adjacent a first type junction area 107. The layouts and circuitries as discussed above provide a tunable ESD trigger-voltage without requiring an increased area to implement in an IC device.

Figure 1D:
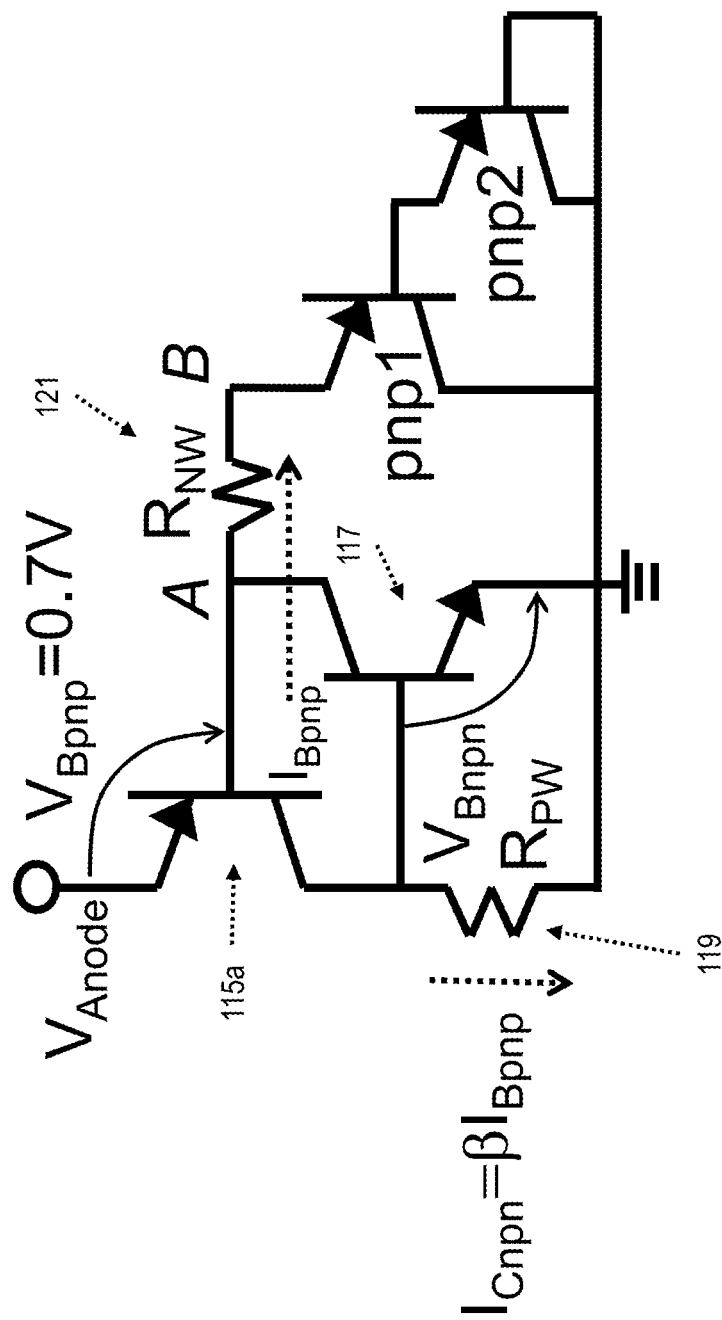
FIG. 1D illustrates an equivalent circuit for a diode triggered SCR, in accordance with an exemplary embodiment.

FIG. 1D illustrates an equivalent circuit for a diode triggered SCR for ESD protection where a PNP transistor 115a turns on as $V_{Anode}$ becomes greater than 2.1V (e.g. 3×0.7V). The NPN transistor turns on and the structure goes into a latchup state, as $\beta I_{Bpnp} \times R_{PW} > V_{Bnpn}$ (0.7V), wherein $V_{Bpnp}/R_{PW} = I_{Cnpn} = \beta I_{Bpnp}$, $I_{Bpnp} = V_{Bpnp}/(\beta R_{PW})$, $V_{AB} = I_{Bpnp} \times R_{NW} = V_{Bpnp} \times R_{NW}/(\beta R_{PW})$, and $V_{Anode} = V_{t1} = 0.7V \times n + V_{AB} = 0.7V \times n + V_{Bpnp} \times R_{Nw}/(\beta R_{PW})$. The Vt1 may be tuned/changed by changing the $R_{NW}$ and $R_{PW}$.

The embodiments of the present disclosure can achieve several technical effects including an ESD protection circuit for FinFET based IC devices with a tunable trigger-voltage having a low snapback-voltage and high current capability. Implementation of the ESD circuit would not require any additional masks or special layout rules. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a substrate including adjacent first-type well areas, over the substrate, each pair of first-type well areas separated by a second-type well area;
providing one or more junction areas in each first and second type well area, each junction area being a first type or a second type;
forming fins, spaced from each other, perpendicular to and over the first and second type junction areas; and
forming junction-type devices by forming electrical connections between the first and second type junction areas in the first-type well areas and the substrate,
wherein a first-stage junction-type device in a first-type well area includes stacked first and second type junction areas, and
wherein the first-stage junction-type device is adjacent a second-type well area including first and second type junction areas.

2. The method according to claim 1, wherein:
the first-type well areas are n-type and include p-type and n-type junction areas.

3. The method according to claim 1, wherein:
the second-type well areas are p-type and include p-type or p-type and n-type junction areas.

4. The method according to claim 1, wherein:
the substrate is p-type and the junction-type devices include pnp or npn type bipolar transistors.

5. The method according to claim 1, wherein:
the junction-type devices include a pn-type diode.

6. The method according to claim 1, comprising:
connecting the junction areas in the second-type well areas to an electrical ground.

7. The method according to claim 1, comprising:
forming isolation trench regions separating the first and second type well areas.

8. The method according to claim 1, wherein:
the second-type well area adjacent the first-stage junction-type device includes multi second-type junction areas.

9. The method according to claim 1, comprising:
setting a spacing between the first and second type junction areas and between adjacent second type junction areas based on a target trigger-voltage.

10. A device comprising:
a substrate including adjacent first-type well areas, over the substrate, each pair of first-type well areas separated by a second-type well area;
one or more junction areas in each first and second type well area, each junction area being a first type or a second type;
fins, spaced from each other, perpendicular to and over the first and second type junction areas; and
junction-type devices formed by electrical connections between the first and second type junction areas in the first-type well areas and the substrate,
wherein a first-stage junction-type device in a first-type well area includes stacked first and second type junction areas, and
wherein the first-stage junction-type device is adjacent a second-type well area including first and second type junction areas.

11. The device according to claim 10, wherein:
the first-type well areas are n-type and include p-type and n-type junction areas.

12. The device according to claim 10, wherein:
the second-type well areas are p-type and include p-type or p-type and n-type junction areas.

13. The device according to claim 10, wherein:
the substrate is p-type and the junction-type devices include pnp or npn type bipolar transistors.

14. The device according to claim 10, wherein:
the junction-type devices include a pn-type diode.

15. The device according to claim 10, comprising:
connections between junction areas in the second-type well areas to an electrical ground.

16. The device according to claim 10, wherein:
the second-type well area adjacent the first-stage junction-type device includes multi second-type junction areas.

17. The device according to claim 10, comprising:
a spacing between the first and second type junction areas and between adjacent second type junction areas is based on a target trigger-voltage.

* * * * *